(12) United States Patent
Shen et al.

(10) Patent No.: US 11,121,775 B2
(45) Date of Patent: Sep. 14, 2021

(54) METHOD OF REARRANGEMENT OF OPTICAL AMPLIFIERS IN FIBER-UPGRADED ELASTIC OPTICAL NETWORK

(71) Applicant: SOOCHOW UNIVERSITY, Suzhou (CN)

(72) Inventors: Gangxiang Shen, Suzhou (CN); Yongcheng Li, Suzhou (CN); Ningning Guo, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 17/042,142

(22) PCT Filed: Sep. 4, 2019

(86) PCT No.: PCT/CN2019/104401
§ 371 (c)(1),
(2) Date: Sep. 27, 2020

(87) PCT Pub. No.: WO2020/107994
PCT Pub. Date: Jun. 4, 2020

(65) Prior Publication Data
US 2021/0021343 A1    Jan. 21, 2021

(30) Foreign Application Priority Data
Nov. 27, 2018   (CN) .......................... 201811426325.0

(51) Int. Cl.
*H04B 10/25* (2013.01)
*G06F 30/18* (2020.01)
(Continued)

(52) U.S. Cl.
CPC ............. *H04B 10/25* (2013.01); *G06F 30/18* (2020.01); *H04B 10/27* (2013.01); *H04B 10/40* (2013.01)

(58) Field of Classification Search
CPC ........ H04B 10/25; H04B 10/27; H04B 10/40; G06F 30/18
(Continued)

(56) References Cited

U.S. PATENT DOCUMENTS

2004/0047028 A1*   3/2004   Ng ..................... H04B 10/2933
                                                       359/341.41
2004/0143428 A1*   7/2004   Rappaport .............. H04L 41/12
                                                       703/22
(Continued)

FOREIGN PATENT DOCUMENTS

CN         106487685 A       3/2017
CN         106788751 A       5/2017
(Continued)

*Primary Examiner* — Dalzid E Singh
(74) *Attorney, Agent, or Firm* — SZDC Law PC

(57) ABSTRACT

The present invention discloses a method of rearrangement of optical amplifiers in a fiber-upgraded elastic optical network, including: traversing through the amplifiers on the upgraded link through a redundancy removal process to remove redundant EDFAs from the upgraded link and calculating the cost saved by the redundancy removal process; rearranging the amplifiers on the upgraded link through a full rearrangement process to rearrange all the EDFAs on the upgraded link and calculating the cost saved by the full rearrangement process; comparing the cost saved by the redundancy removal process with the cost saved by the full rearrangement process on the upgraded link and selecting a process that saved more costs as the method of rearrangement of optical amplifiers on the upgraded link; and perform rearrangement of optical amplifiers on all the upgraded links sequentially. This method can minimize the number of
(Continued)

optical amplifiers without significantly reducing spectrum resource utilization.

7 Claims, 3 Drawing Sheets

(51) Int. Cl.
  *H04B 10/27* (2013.01)
  *H04B 10/40* (2013.01)
(58) Field of Classification Search
  USPC .......................................................... 398/145
  See application file for complete search history.

(56) References Cited

U.S. PATENT DOCUMENTS

| | | | |
|---|---|---|---|
| 2009/0257749 | A1 | 10/2009 | Rasztovits-Wiech |
| 2010/0040365 | A1* | 2/2010 | Kit Leung .......... H04J 14/0283 398/26 |
| 2011/0085230 | A1 | 4/2011 | Rapp et al. |
| 2012/0123815 | A1* | 5/2012 | Peterson ............. H04J 14/0263 705/7.11 |
| 2013/0089323 | A1* | 4/2013 | Patel .................. H04B 10/0793 398/27 |
| 2017/0206292 | A1* | 7/2017 | Bennett ................... G06F 30/20 |
| 2020/0028608 | A1* | 1/2020 | Bathula ................ H04L 41/145 |

FOREIGN PATENT DOCUMENTS

| | | |
|---|---|---|
| CN | 108199881 A | 6/2018 |
| CN | 109543314 A | 3/2019 |

* cited by examiner (a)                (b)

METHOD OF REARRANGEMENT OF OPTICAL AMPLIFIERS IN FIBER-UPGRADED ELASTIC OPTICAL NETWORK

This application is the National Stage Application of PCT/CN2019/104401, filed on Sep. 4, 2019, which claims priority to Chinese Patent Application No. 201811426325.0, filed on Nov. 27, 2018, which is incorporated by reference for all purposes as if fully set forth herein.

FIELD OF THE INVENTION

The present invention relates to the technical field of optical networks, and more particularly, to a method of rearrangement of optical amplifiers in a fiber-upgraded elastic optical network.

BACKGROUND OF THE INVENTION

Today, techniques of fabricating Ultra Low Loss (ULL) fibers have become mature. ULL fibers have a lower attenuation coefficient than Standard Single Mode Fibers (SSMFs), which enables better quality of network signal transmission through ULL fibers, making them suitable for use in future optical networks of ultra large capacity and over ultra-long distances. Therefore, ULL fibers are considered as an essential technique for providing super optical channels of advanced modulation format and high spectrum efficiency in future optical transmission networks. Also, as many SSMFs deployed in the backbone network in the last century are reaching the end of their service life, ULL fibers can replace these legacy SSMFs so that the transmission performance of current optical transmission networks can be significantly improved. Such ULL fiber upgrades for optical transmission networks represent a development trend among network operators.

Currently, researches at home and abroad have been based on the constant positioning of optical amplifiers, such as EDFAs. However, after the network links are upgraded with ULL fibers, due to their lower attenuation coefficient, the amplification span between these optical amplifiers can be extremely increased. Therefore, network operators want to reduce the number of optical amplifiers used in the network through optimum rearrangement of optical amplifiers along the links in order to save system costs including hardware cost and maintenance cost. However, increased amplification span may require higher amplification gains, resulting in higher Amplifier Spontaneous Emission (ASE) noises and consequently degraded quality of optical transmission signal. This will cause a lower level modulation format to be used in optical channels, thereby occupying more spectrum resources and consequently influencing spectrum use efficiency of the network.

SUMMARY OF THE INVENTION

The present invention aims to address the technical problem of providing a method of rearrangement of optical amplifiers in a fiber-upgraded elastic optical network that can minimize the number of optical amplifiers without significantly reducing spectrum resource utilization and consequently improve resource utilization while saving the costs.

In order to solve the technical problem mentioned above, the present invention provides a method of rearrangement of optical amplifiers on a fiber link. After the fiber links are upgraded in an optical network, upgraded links are obtained and the following operations are performed on one of the upgraded links: attempting to traverse through the amplifiers on the upgraded link through a redundancy removal process to remove redundant EDFAs from the upgraded link and calculating the cost $C_{RR}$ saved by the redundancy removal process; attempting to rearrange the amplifiers on the upgraded link through a full rearrangement process to rearrange all the EDFAs on the upgraded link and calculating the cost $C_{FR}$ saved by the full rearrangement process; comparing the cost $C_{RR}$ saved by the redundancy removal process with the cost $C_{FR}$ saved by the full rearrangement process on the upgraded link and selecting a process that saved more costs as the method of rearrangement of optical amplifiers on the upgraded link; and repeating the above steps to perform rearrangement of optical amplifiers on all the upgraded links sequentially and finish rearrangement for all the upgraded links.

Preferably, the attempting to traverse through the amplifiers on the upgraded link through a redundancy removal process to remove redundant EDFAs from the upgraded link includes specifically:

S11 defining a maximum amplification span D for the upgraded link;

S12 summing the two adjacent amplification spans previous and subsequent to each amplifier on the upgraded link to obtain a summed value l; and S13 comparing the summed value l with the maximum amplification span D; removing the amplifier if the summed value l is lower than the maximum amplification span D; and keeping the amplifier if the summed value l is greater than the maximum amplification span D.

Preferably, the attempting to rearrange the amplifiers on the upgraded link through a full rearrangement process to rearrange all the EDFAs on the upgraded link includes specifically:

S21 removing all the amplifiers on the upgraded link; and
S22 repositioning the EDFAs along the upgraded link.

Preferably, EDFAs are repositioned along the upgraded link in such a manner that the amplification span distance between two adjacent EDFAs is M, the amplification span distance M satisfies $$l/\left(\frac{l}{D}\right) - 10 \leq M \leq l/\left(\frac{l}{D}\right) + 10,$$

where l is the sum of the two adjacent amplification spans previous and subsequent to the amplifier, and D is the maximum amplification span on the upgraded link.

Preferably, $$l/\left(\frac{l}{D}\right) + 10 \leq D.$$

Preferably, the cost $C_{RR}$ saved by the redundancy removal process is calculated as $C_{RR}=N_e \cdot (C_e+C_p)$, where $C_e$ is the hardware cost and $C_p$ is the total cost of power supply and maintenance for the EDFAs.

Preferably, the cost $C_{FR}$ saved by the full rearrangement process is calculated as $C_{FR}=N_e \cdot (C_e+C_p)-\phi C_r$, where $C_e$ is the hardware cost, $C_p$ is the total cost of power supply and maintenance for the EDFAs, $\phi_r$ is the number of newly built positioning spaces, $C_r$ is the cost of building the newly built positioning spaces, and $N_e$ is the reduced number of amplifiers on the link.

The present invention has the beneficial effects as follows. The redundancy removal process and the full rearrangement process are compared to select the process that enables more cost saving for rearrangement of the amplifiers on the fiber link, thereby minimizing the number of optical amplifiers without significantly reducing spectrum resource utilization, and consequently improving resource utilization while saving the costs.

DETAILED DESCRIPTION OF THE EMBODIMENTS

The present invention will be further described below with reference to the drawings and specific embodiments, so that those skilled in the art can better understand and implement the present invention, but the embodiments listed are not intended to limit the present invention.

It is appreciated that the terms appearing in this application, Erbium-doped fiber amplifier, i.e. EDFA, standard single mode fiber, i.e. SSMF, and ultra low loss fiber, i.e., ULL fiber, are all technical terminology in this art.

Figure 1:
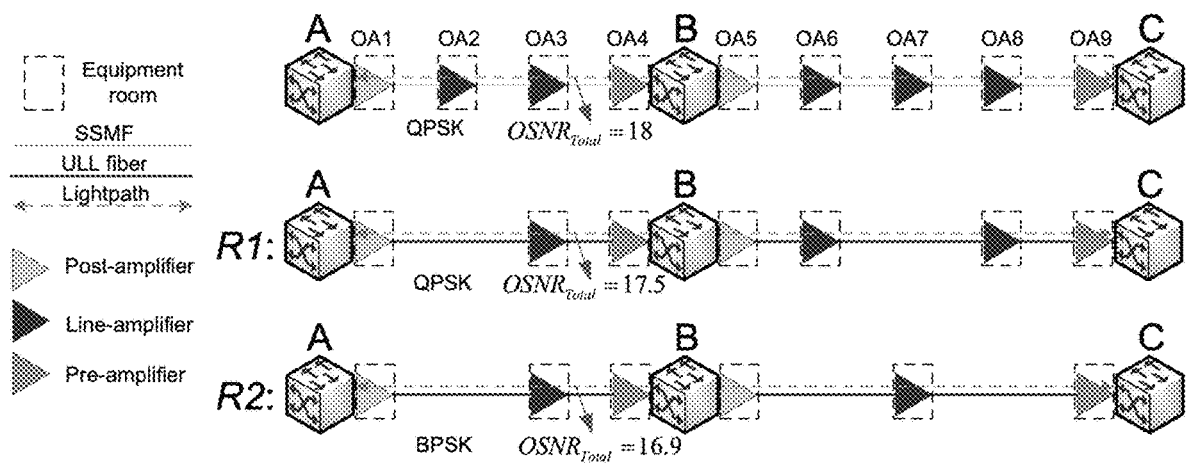
FIG. 1 is a schematic view illustrating removing optical amplifiers from Ultra Low Loss fiber links according to the present invention.

After a network link is upgraded with ULL fibers, the lower attenuation characteristic thereof allows network operators to increase the amplification span between two adjacent EDFAs on the link. FIG. 1 shows an example of how EDFA removal has changed the number of EDFAs used and the Optical Signal to Noise Ratio (OSNR) of an optical channel. In this example, there are two links, A-B and B-C. They are both upgraded with ULL fibers. A pair of a pre-amplifier and a post-amplifier are provided at the ends of each link, between which a line amplifier is provided. The pre-amplifier and post-amplifier are hosted in the same equipment room by a node equipment. Typically, separate spaces are built for positioning and management of each line amplifier. For an SSMF (standard single mode fiber) link, the amplification span is typically no greater than 80 km. As the ULL fibers have a lower attenuation coefficient after the upgrade, their maximum amplification span can be extended to 120 km. Therefore, some EDFAs on the link become redundant and can be removed. Two rearrangement schemes R1 and R2 are compared, of which R1 removes the optical amplifiers OA2 and OA7, and R2 removes more EDFAs, including OA2, OA6, and OA8. With removal of these EDFAs, the OSNR through these links is reduced accordingly. For example, in R1, the OSNR of the optical channel A-C is reduced from 18 dB to 17.5 dB, while still meeting OSNR requirement for Quadrature Phase Shift Keying (QPSK). Therefore, in the case that its initial modulation format is QPSK, the number of frequency slots (FSs) used by the channel is unchanged. In contrast, in R2, the OSNR of the optical channel is reduced from 18 dB to 16.9 dB, which does not meet the OSNR tolerance requirement for QPSK. Accordingly, a lower level modulation format (i.e. BPSK) has to be used and consequently more FSs are needed. It is suggested by this example that different rearrangement schemes may result in different compromises between the number of EDFAs used and the spectrum resource consumed.

Figure 2:
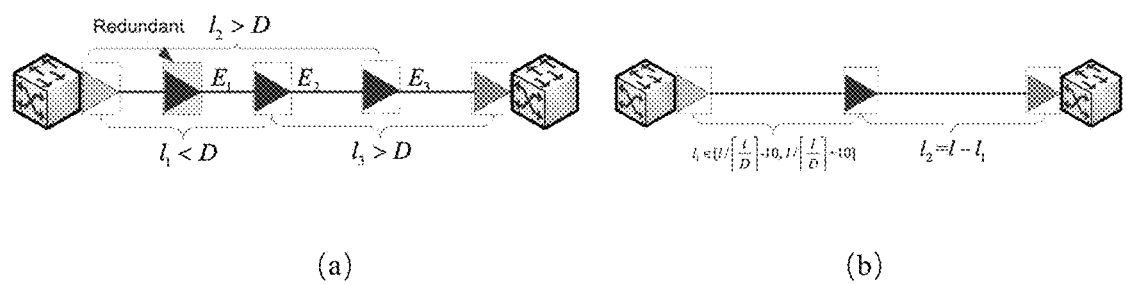
FIG. 2 is a schematic view illustrating a redundant EDFA removal strategy and EDFA rearrangement strategy according to the present invention.

With reference to FIG. 2, the present invention discloses a method of rearrangement of optical amplifiers in a fiber-upgraded elastic optical network, in which after fiber link upgrade in the optical network, upgraded links are obtained, and the following operations are performed on one of the upgraded links:

(1) redundancy removal (abbreviated as RR strategy): attempting to traverse through the amplifiers on the upgraded link through a redundancy removal process to remove redundant EDFAs from the upgraded link and calculating the cost $C_{RR}$ saved by the redundancy removal process; where the cost $C_{RR}$ saved by the redundancy removal process is calculated as $C_{RR} N_e \cdot (C_e + C_p)$, where $C_p$ is the hardware cost, $C_p$ is the total cost of power supply and maintenance for the EDFAs, and $N_e$ is the reduced number of amplifiers on the link.

The attempting to traverse through the amplifiers on the upgraded link through a redundancy removal process to remove redundant EDFAs from the upgraded link includes specifically:

S11 defining a maximum amplification span D for the upgraded link;

S12 summing the two adjacent amplification spans previous and subsequent to each amplifier on the upgraded link to obtain a summed value 1; and S13 comparing the summed value 1 with the maximum amplification span D; removing the amplifier if the summed value 1 is lower than the maximum amplification span D; and keeping the amplifier if the summed value 1 is greater than the maximum amplification span D.

For example, in FIG. 2(a), the sum of the two adjacent amplification spans previous and subsequent to an amplifier $E_1$ is $l_1$, and since $l_1$ is lower than D, $E_1$ can be removed; and the sum of the two adjacent amplification spans previous and subsequent to an amplifier $E_2$ is $l_2$, and since $l_2$ is greater than D, $E_2$ cannot be further removed. The same goes for $E_3$. In this way, one EDFA can be reduced.

(2) full rearrangement (abbreviated as FR strategy): attempting to rearrange the amplifiers on the upgraded link through a full rearrangement process to rearrange all the EDFAs on the upgraded link and calculating the cost $C_{FR}$ saved by the full rearrangement process; where the cost $C_{FR}$ saved by the full rearrangement process is calculated as $C_{FR} = N_e \cdot (C_e + C_p) - \phi_r \cdot C_r$, where $C_e$ is the hardware cost, $C_p$ is the total cost of power supply and maintenance for the EDFAs, $\phi_r$ is the number of newly built positioning spaces, and $C_r$ is the cost of building the newly built positioning spaces.

The attempting to rearrange the amplifiers on the upgraded link through a full rearrangement process to rearrange all the EDFAs on the upgraded link includes specifically:

S21 removing all the amplifiers on the upgraded link; and

S22 repositioning the EDFAs along the upgraded link, in such a manner that the amplification span distance between two adjacent EDFAs is M, the amplification span distance M satisfies $$U\left(\frac{l}{D}\right) - 10 \leq M \leq U\left(\frac{l}{D}\right) + 10,$$

where l is the sum of the two adjacent amplification spans previous and subsequent to the amplifier, and D is the maximum amplification span on the upgraded link with an upper limit $$U\left(\frac{l}{D}\right) + 10 \leq D.$$

For example, in FIG. 2(b), if l=170 km and D=120 km, then the amplification span M is in the range of $$\left[U\left(\frac{l}{D}\right) - 10, U\left(\frac{l}{D}\right) + 10\right],$$

and two EDFAs can be removed. Compared with the RR strategy, the FR strategy can reduce one more EDFA.

(3) cost minimization (abbreviated as CM strategy): comparing the cost $C_{RR}$ saved by the redundancy removal process with the cost $C_{FR}$ saved by the full rearrangement process on the upgraded link and selecting a process that saved more costs is selected as the method of rearrangement of optical amplifiers on the upgraded link.

For example, the hardware cost $C_e$ for EDFA is normalized to the unit of 1.0, and the cost $C_r$ of building new positioning spaces for EDFA is also normalized to the unit of 1.0. The total cost $C_p$ of power supply and maintenance for the EDFAs in the life cycle is 7.0 units, and as shown in FIGS. 2(a) and (b), the cost saved by the RR strategy is 8 units and the cost saved by the FR strategy is 15 units. Therefore, the FR strategy is selected for rearrangement of EDFAs.

(4) repeating the above steps (1), (2), and (3) to perform rearrangement of optical amplifiers on all the upgraded links sequentially and finish rearrangement for all the upgraded links.

In another example, the optical network includes two test networks to be improved, a 14 node and 21 link NSFNET network and a 24 node and 43 link USA backbone network (USNET). The attenuation coefficient of ULL fibers is, for example, 0.168 dB/km. For initial EDFA positioning based on an SSMF link, the initially defined maximum amplification span is D=80 km. Based on this initial positioning, rearrangement of EDFAs is performed on a network of upgraded ULL fiber links by using the method of the present invention. Besides, each fiber link has 320 FSs each having a bandwidth of 12.5 GHz. Four modulation formats, i.e. BPSK, QPSK, 8-QAM, and 16-QAM are used for establishment of a light path. The traffic volume demanded between nodes in each pair is randomly positioned in the range of [10, 400] Gb/s.

Figure 3:
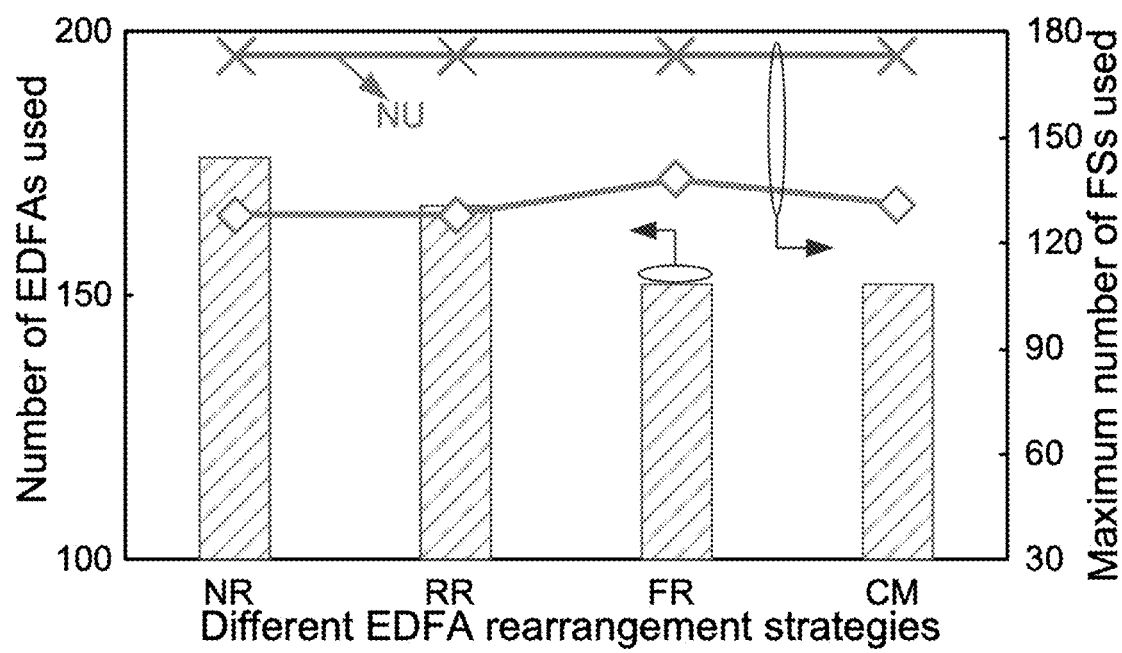
FIG. 3 is a view illustrating different EDFA rearrangement strategies for a USNET network according to the present invention.
Figure 4:
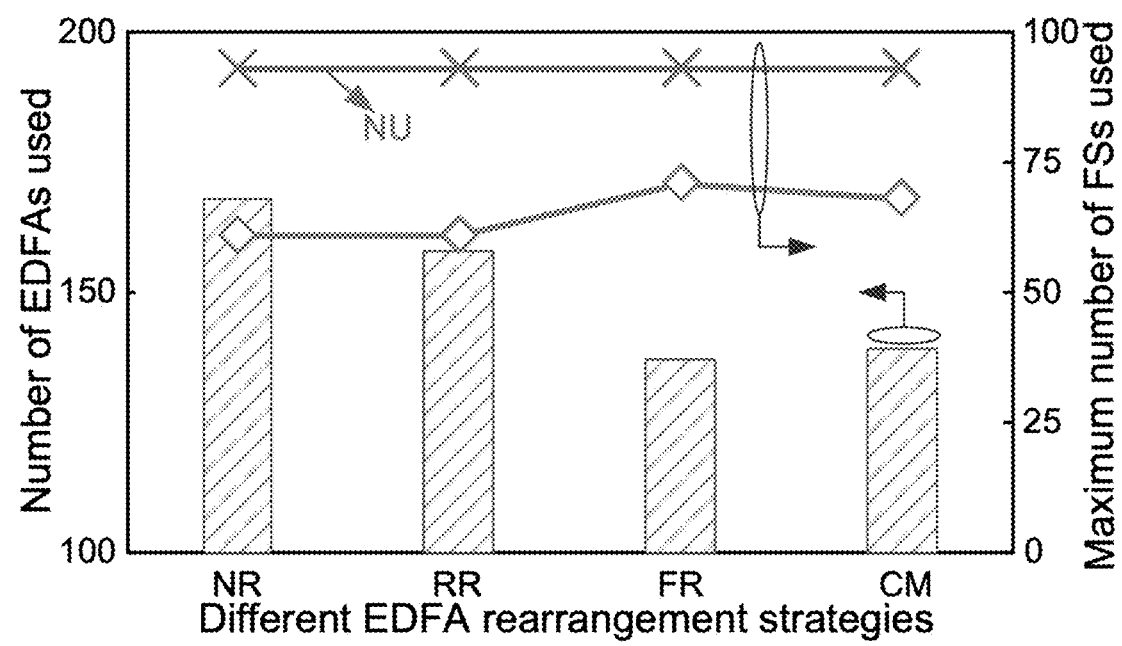
FIG. 4 is a view illustrating different EDFA rearrangement strategies for an NSFNET network according to the present invention.

FIG. 3 is a view illustrating the performance of different EDFA rearrangement strategies in terms of the number of EDFAs used and the maximum number of FSs used in a USNET network, where D=100 km. The legend "NR" corresponds to the case without EDFA rearrangement. The legends "RR", "FR", and "CM" correspond respectively to RR, FR, and CM strategies. It can be seen that the NR strategy requires the greatest number of EDFAs but the least maximum number of FSs used. In contrast, the FR strategy requires the least number of EDFAs but has the greatest number of FSs used. This is because the FR strategy minimizes the number of EDFAs used, which significantly influences the OSNR in the optical channel links. This may lower the level of modulation format for some optical channels, thereby influencing the spectrum efficiency and finally increasing the maximum number of FSs used in the network. The RR strategy has a result similar to that of the NR strategy. In the end, the CM strategy is the best. It enables the maximum number of FSs used that is similar to the NR and RR strategies. However, the number of EDFAs it uses is similar to that of the FR strategy. This is because the CM strategy has the advantages of both the RR and the FR strategies. Besides, compared with the scenario where SSMF is used (that is, the legend "NU"), when all the links are upgraded to ULL fibers in all these strategies, the number of FSs is significantly reduced. We made a similar research on an NSFNET network and obtained a result which, as shown in FIG. 4, suggests that as before, the CM strategy achieves the optimum performance in terms of the number of EDFAs used and the spectrum resources consumed.

Figure 5:
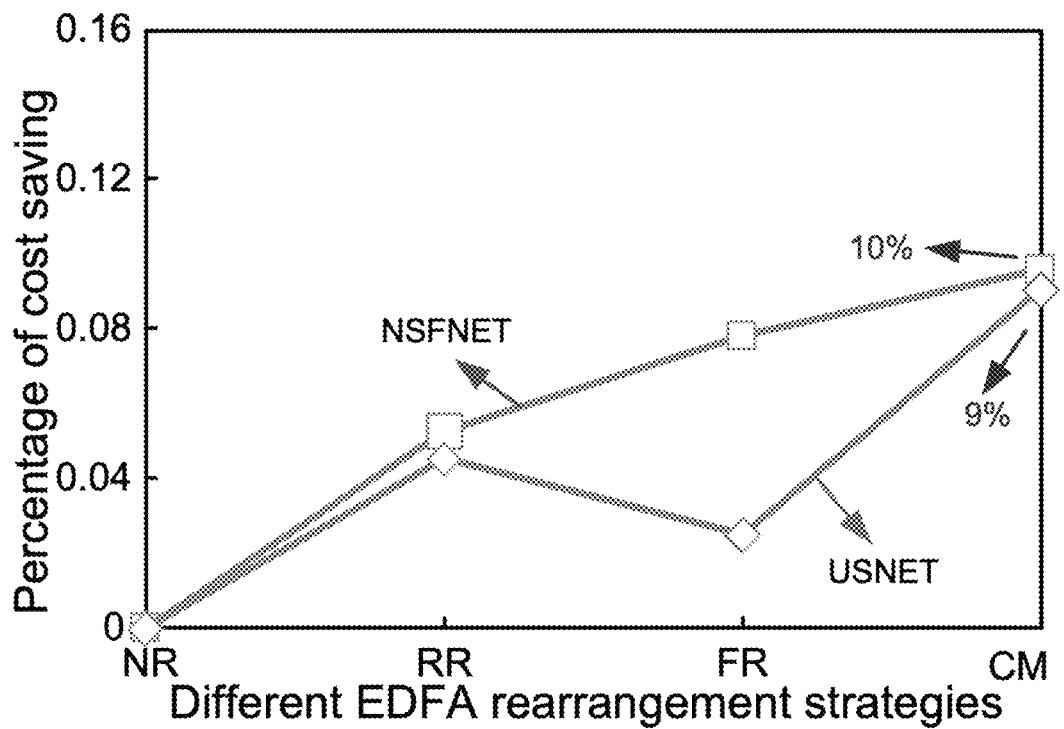
FIG. 5 is a schematic view showing cost saving by different EDFA rearrangement strategies according to the present invention.

We also evaluated the total cost saved by different strategies. The costs saved are calculated by $C_{RR}=N_e \cdot (C_e+C_p)$ and $C_{FR}=N_e \cdot (C_e+C_p) - \phi_r \cdot C_r$. As shown in FIG. 5, the CM strategy exhibits the best performance in terms of cost saving, which is up to 9% and 10% in a USENT network and an NSFNET network respectively. The reason for this phenomenon corresponds to the reason for the reduced number of EDFAs used.

Figure 6:
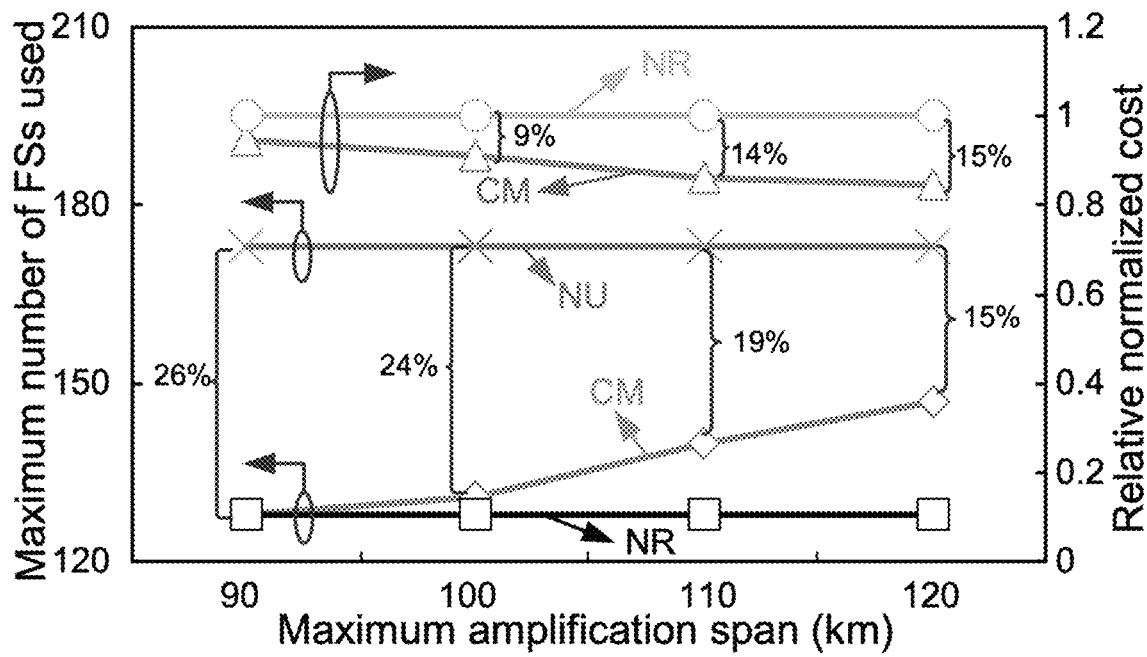
FIG. 6 is a schematic view showing the performance of an CM strategy at different amplification spans.

As shown in FIG. 6, the performance of the CM strategy varies with the increase of different amplification spans. This figure shows how the maximum amplification span influences the performance of a USNET network under the CM strategy. Here, the total cost of deploying and running EDFAs under the NR strategy is normalized to 1.0. As the maximum amplification span increases, the advantage of the CM strategy becomes even greater. However, this comes at the cost of a potential increase in the maximum number of FSs used. When the maximum amplification span is 100 km, the maximum number of FSs used by the CM strategy is slightly greater than that of the NR strategy, by about 2% (nonetheless still much lower than the maximum number of FSs used by the NU strategy by about 24%). However, at this maximum amplification span, the total cost saved by the CM strategy is up to about 9%. Therefore, in this case, 100 km is the optimum amplification span at which the CM strategy can achieve its beneficial effects to the greatest extent.

The above-mentioned embodiments are only preferred embodiments for fully illustrating the present invention, and the protection scope of the present invention is not limited thereto. Equivalent substitutions or changes made by those skilled in the art on the basis of the present invention shall fall within the protection scope of the present invention. The protection scope of the present invention is defined by the claims.

What is claimed is:

1. A method of rearrangement of optical amplifiers in a fiber-upgraded elastic optical network, wherein after the fiber links have been upgraded in the optical network, upgraded links are obtained and the following operations are performed on one of the upgraded links:

attempting to traverse through the amplifiers on the upgraded link through a redundancy removal process to remove redundant EDFAs from the upgraded link and calculating the cost $C_{RR}$ saved by the redundancy removal process;

attempting to rearrange the amplifiers on the upgraded link through a full rearrangement process to rearrange all the EDFAs on the upgraded link, and calculating the cost $C_{FR}$ saved by the full rearrangement process;

comparing the cost $C_{RR}$ saved by the redundancy removal process with the cost CFR saved by the full rearrangement process on the upgraded link and selecting a process that saved more costs as the method of rearrangement of optical amplifiers on the upgraded link; and repeating the above steps to perform rearrangement of optical amplifiers on all the upgraded links sequentially and finish rearrangement for all the upgraded links.

2. The method of rearrangement of optical amplifiers in a fiber-upgraded elastic optical network of claim 1, wherein the attempting to traverse through the amplifiers on the upgraded link through a redundancy removal process to remove redundant EDFAs from the upgraded link includes specifically the steps of:

S11 defining a maximum amplification span D for the upgraded link;

S12 summing the two adjacent amplification spans previous and subsequent to each amplifier on the upgraded link to obtain a summed value l; and S13 comparing the summed value l with the maximum amplification span D; removing the amplifier if the summed value l is lower than the maximum amplification span D; and keeping the amplifier if the summed value l is greater than the maximum amplification span D.

3. The method of rearrangement of optical amplifiers in a fiber-upgraded elastic optical network of claim 1, wherein the attempting to rearrange the amplifiers on the upgraded link through a full rearrangement process to rearrange all the EDFAs on the upgraded link includes specifically the steps of:

S21 removing all the amplifiers on the upgraded link; and
S22 repositioning the EDFAs along the upgraded link.

4. The method of rearrangement of optical amplifiers in a fiber-upgraded elastic optical network of claim 3, wherein the repositioning the EDFAs along the upgraded link includes specifically:

repositioning the EDFAs along the upgraded link in such a manner that the amplification span distance between two adjacent EDFAs is M, the amplification span distance M satisfies $$U\left(\frac{l}{D}\right) - 10 \le M \le U\left(\frac{l}{D}\right) + 10,$$

where l is the sum of the two adjacent amplification spans previous and subsequent to the amplifier, and D is the maximum amplification span on the upgraded link.

5. The method of rearrangement of optical amplifiers in a fiber-upgraded elastic optical network of claim 4, wherein $$U\left(\frac{l}{D}\right) + 10 \le D.$$

6. The method of rearrangement of optical amplifiers in a fiber-upgraded elastic optical network of claim 1, wherein the cost $C_{RR}$ saved by the redundancy removal process is calculated as $C_{RR}=N_e\bullet(C_e+C_p)$, where $C_e$ is the hardware cost, $C_p$ is the total cost of power supply and maintenance for the EDFAs, and $N_e$ is the reduced number of amplifiers on the link.

7. The method of rearrangement of optical amplifiers in a fiber-upgraded elastic optical network of claim 1, wherein the cost $C_{FR}$ saved by the full rearrangement process is calculated as $C_{FR}=N_e\bullet(C_e+C_p)-\phi_r\bullet C_r$, where $C_e$ is the hardware cost, $C_p$ is the total cost of power supply and maintenance for the EDFAs, $\phi_r$ is the number of newly built positioning spaces, and $C_r$ is the cost of building the newly built positioning spaces.

* * * * *